United States Patent
Caiger

(10) Patent No.: US 8,999,180 B2
(45) Date of Patent: *Apr. 7, 2015

(54) PROCESS FOR MANUFACTURING SOLAR CELLS

(75) Inventor: Nigel Anthony Caiger, Wookey Hole (GB)

(73) Assignee: Sun Chemical Corporation, Parsippany, NJ (US)

( * ) Notice: Subject to any disclaimer, the term of this patent is extended or adjusted under 35 U.S.C. 154(b) by 765 days.

This patent is subject to a terminal disclaimer.

(21) Appl. No.: 12/375,510

(22) PCT Filed: Aug. 6, 2007

(86) PCT No.: PCT/US2007/075255
§ 371 (c)(1), (2), (4) Date: Jul. 21, 2009

(87) PCT Pub. No.: WO2008/021782
PCT Pub. Date: Feb. 21, 2008

(65) Prior Publication Data
US 2009/0308435 A1    Dec. 17, 2009

(30) Foreign Application Priority Data
Aug. 7, 2006 (GB) .................................. 0615651.7

(51) Int. Cl.
| | | |
|---|---|---|
| B29D 11/00 | (2006.01) | |
| B44C 1/22 | (2006.01) | |
| B05D 5/12 | (2006.01) | |
| H01L 31/0224 | (2006.01) | |
| C09D 11/34 | (2014.01) | |

(52) U.S. Cl.
CPC ........ *H01L 31/022425* (2013.01); *C09D 11/34* (2013.01); *Y02E 10/50* (2013.01)

(58) Field of Classification Search
CPC ........ C09D 11/34; C09D 5/008; H01L 31/00; H01L 31/022425; H05K 3/00; Y02E 10/50
USPC .............. 216/24, 41, 42, 99, 103; 427/58, 74, 427/511
See application file for complete search history.

(56) References Cited

U.S. PATENT DOCUMENTS

| | | | |
|---|---|---|---|
| 4,251,327 A | | 2/1981 | Grenon |
| 4,758,276 A | | 7/1988 | Lin et al. |
| 5,011,565 A | | 4/1991 | Dube et al. |
| 5,118,953 A | * | 6/1992 | Ota et al. ...................... 250/548 |
| 5,779,779 A | * | 7/1998 | Jolly ............................. 106/31.29 |
| 5,882,435 A | | 3/1999 | Holdermann |
| 5,965,196 A | | 10/1999 | Sawada |
| 6,022,678 A | * | 2/2000 | Makino ......................... 430/501 |
| 6,048,406 A | | 4/2000 | Misra et al. |
| 6,184,057 B1 | * | 2/2001 | Van Andel et al. ............. 438/66 |
| 6,336,720 B1 | * | 1/2002 | Suzuki et al. .................... 347/88 |
| 6,379,569 B1 | * | 4/2002 | Rouberol ......................... 216/13 |
| 6,402,924 B1 | * | 6/2002 | Martin et al. ................. 205/103 |
| 6,666,986 B1 | * | 12/2003 | Vaartstra ...................... 252/79.1 |
| 6,998,288 B1 | | 2/2006 | Smith et al. |
| 2003/0017641 A1 | * | 1/2003 | Adachi et al. ................... 438/57 |
| 2004/0081914 A1 | * | 4/2004 | Imai et al. ................. 430/281.1 |
| 2005/0165152 A1 | | 7/2005 | Barr et al. |
| 2006/0121389 A1 | | 6/2006 | Anzures et al. |
| 2008/0245768 A1 | | 10/2008 | Cottrell et al. |
| 2010/0129754 A1 | | 5/2010 | Cheetham et al. |
| 2011/0287634 A1 | | 11/2011 | Barr et al. |

FOREIGN PATENT DOCUMENTS

| | | |
|---|---|---|
| JP | 2000-31131 A | 1/2000 |
| WO | 02/053659 A2 | 7/2002 |
| WO | 03075351 | 9/2003 |
| WO | WO 2005/045098 | 5/2005 |
| WO | 2009/156400 A1 | 12/2009 |

OTHER PUBLICATIONS

International Search Report and Written Opinion of the International Searching Authority issued for International Application No. PCT/US2007/075255, Oct. 31, 2008.
Office Action issued on Aug. 15, 2012 in connection with Malaysian Patent Application No. PI 20090474.
Korean Office Action dated Nov. 22, 2013, issued in counterpart Korean Application No. 2013-080884042 and English language translation thereof.
Hennequin, Jean-Francois, "Distributions Energetique Et Angulaire De L'emission Ionique Secondaire," Le Journal de Physique, vol. 29, Jul. 1968. p. 655-663.
Grigoras, K and Pacebutas, V.,"Porous Silicon Fabrication technique for large area devices," Review of Scientific Instruments, vol. 67, issue 6, pp. 2337-2338, Jun. 1996.
Pastirik, E., "The development of a method of producing etch resistant wax patterns on solar cells." Report No. DOE/JPL-955324-80/4, Nov. 1980.
KIC Chemical, Inc. Analysis report on Palmitic Acid.
KIC Chemical, Inc. Analysis report on Stearic Acid.
Patent Invalidation Request Form and English translation for Chinese Pat. No. 200780036644.4, dated Feb. 27, 2014.
Handbook of Print Media: Technologies and Production Methods, Ed: Kipphan, H., Springer-Verlag Berlin Heidelberg, 2001, pp. 134-135.

\* cited by examiner

*Primary Examiner* — Shamim Ahmed
(74) *Attorney, Agent, or Firm* — Charles C. Achkar; Ostrolenk Faber LLP

(57) ABSTRACT

A process of manufacturing a solar cell is provided. The process comprising the steps of: i) ink jet printing an alkali removable water insoluble hot melt ink jet ink onto a substrate comprising a silicon wafer to form a resist image on the substrate; ii) etching or plating the substrate in an aqueous acid medium; and iv) removing the resist image with an aqueous alkali.

19 Claims, No Drawings

PROCESS FOR MANUFACTURING SOLAR CELLS

CROSS REFERENCE TO RELATED APPLICATIONS

This application is the United States national phase filing of the corresponding international application number PCT/US2007/075255, filed on Aug. 6, 2007, which claims priority to and benefit of Great Britain application no. 0615651.7, filed Aug. 7, 2006, which applications are hereby incorporated by reference in their entirety.

TECHNICAL FIELD

The present invention relates to a process for manufacturing solar cells.

BACKGROUND OF THE INVENTION

The solar cell is a well known device for converting sunlight into electrical energy. Such solar cells comprise a silicon wafer having a number of p- and n-doped regions which together generate a potential difference and current when exposed to sunlight.

In addition to the base silicon wafer, solar cells typically comprise electrical contact structures for collecting the electricity from the doped regions. Those structures typically include one or more layers of metal, together with insulating layers and passivating layers, and often an uppermost layer of a solderable metal to give good solder contact with a support frame. Solar cells are described in, for example, U.S. Pat. No. 6,333,457, US 2004/0200520 and U.S. Pat. No. 6,337,283.

The manufacture of solar cells, and in particular the creation of the electrical contact structures, typically involves multiple stages of electroplating and/or etching. For example, it may be necessary to etch away specific areas of a silicon dioxide passivating layer in order to allow a subsequently deposited metal layer to make contact with doped regions of the wafer, or it may be necessary to deposit a conductive metal such as copper in a specific pattern so that it contacts, say, the p-doped regions but not the n-doped regions. One method of selectively etching and plating predetermined regions of the wafer is to apply a protective masking material, known as a resist, to those areas which are not to be etched or plated, thereby preventing etching or plating in those regions, subjecting the wafer to the etching or plating process, and then removing the resist, typically by spraying or washing with aqueous alkali.

Conventionally, the resists are applied to the wafer using screen printing. That technique gives good image definition and is reliable. The screen printing of resists during solar cell manufacture is described in, for example, WO 2005/013323 and WO 2005/011979.

Recently, there has been a move to using thinner, more delicate silicon wafers, and to make electrical contact structures having a finer level of detail. Accordingly, there is a need for an improved method of etching and/or plating.

SUMMARY OF THE INVENTION

The invention provides a process of manufacturing a solar cell comprising the steps of:
i) ink jet printing an alkali removable water insoluble hot melt ink jet ink onto a substrate comprising a silicon wafer to form a resist image on the substrate;
ii) etching or plating the substrate in an aqueous acid medium; and
iii) removing the resist image with an aqueous alkali.

DETAILED DESCRIPTION OF THE INVENTION

Ink jet printing is a non-contact method, in contrast to screen printing in which the resist ink is applied using a flexible blade or squeegee. Ink jet printing therefore applies almost no stress on the substrate. Furthermore, ink jet printing allows the creation of images direct from a computer, without the need for intermediate artwork as is required in screen printing.

The resist ink may be printed onto the substrate using any ink jet printer which is suitable for printing hot melt inks. Print heads suitable for printing hot melt inks are available from Spectra.

The process of the invention may be used at any suitable stage in the manufacture of a solar cell. The substrate may be a doped or undoped base silicon wafer of the type used in solar cells. The substrate may alternatively be a silicon wafer having one or more coatings or layers, for example, a passivating layer of silicon dioxide and/or one or more metal layers.

The substrate may be a silicon wafer having a passivating layer of silicon dioxide on at least one surface upon which in step i) the ink jet ink is printed and which is etched during step ii), for example, using an aqueous solution of hydrogen fluoride and/or ammonium fluoride.

The substrate may comprise a silicon wafer surface having surface metal layer upon which the ink jet ink is printed. The metal may be any metal (including mixtures of metals) used in the manufacture of solar cells which is subject to etching or plating, for example, copper, titanium-tungsten, or aluminium. The process may involve depositing a further metal layer such as a copper or tin layer on the metal layer of the substrate by electroplating. The electroplating is typically carried out by dipping or immersing the substrate into a bath of acidic aqueous electroplating medium, for example, an aqueous solution of sulphuric acid and a metal salt. Alternatively, the process may involve etching the metal layer, for example, using an aqueous solution comprising sulphuric acid and hydrogen peroxide, or a "PAWN" (phosphoric acid, acetic acid, water and nitric acid) etching solution.

The component of the ink will be chosen such that the ink is stable in use with respect to the particular etching or plating solutions to be used.

Following the electroplating or etching, the solar cell substrate may optionally be washed or rinsed one or more times with water to remove traces of the etching or plating solution.

The removal of the resist ink image may be done in any suitable way, for example, by immersing the etched or plated substrate in a bath of aqueous alkali or by spraying with aqueous alkali, for example, a dilute solution of potassium hydroxide. Preferably, the ink and the washing conditions are such that the ink dissolves completely rather than leaving a particulate residue or flakes which might clog machine pipes, filter screens or drains.

The ink used in the process of the invention is a hot melt ink, that is, it is a solid at ambient temperature, say, 25° C. and is melted in the printer and jetted hot onto the substrate. The inventors have found that hot melt ink jet inks give particularly good resist image definition because they cool and solidify very rapidly following contact with the substrate, thereby inhibiting spreading of the ink. Conventional ink jet hot melt inks as used in the printing industry are based largely on hydrocarbon waxes and are therefore completely insoluble in aqueous media. Such conventional hot melt inks can be removed only by washing with organic solvents or by mechanical scraping and have not found application as resists. The inventors have found that it is possible to formulate hot melt inks which are suitable for application by ink jet and which can be easily removed by washing with aqueous alkali, whilst being insoluble in acidic media used for etching and plating of solar cells.

The term "alkali removable" as used herein means that the ink may be removed easily from the substrate using the aqueous alkali conditions commonly employed during the etching and plating of solar cells.

The term "water insoluble" as used herein means that the ink is insoluble both in neutral water (pH 7.0-6.5) and also in the aqueous acid media commonly used during the etching and plating of solar cells and will therefore not be removed from the substrate during the etching or plating step, or in any associated water rinsing step.

The terms "water washability" and "alkali washability" and the like as used herein refer to water and alkali washability as determined by the test methods given below.

Optionally, the ink has an alkali washability of at least 80%, preferably at least 90%, more preferably at least 95%, and especially preferably at least 99%.

Optionally, the ink has a water washability of less than 20%, preferably less than 10%, more preferably less than 5%, and especially preferably less than 1%.

The ink will typically comprise components which are soluble or dispersible in aqueous alkali. Preferably, the ink consists essentially of components which are alkali soluble or which disperse in aqueous alkali to particles which are smaller than 10 microns (μm) in diameter. For example, many pigments will not be soluble in aqueous alkali but will disperse when the ink is washed off the substrate into particles which are less than 10 μm in diameter (that is, they pass through a 10 micron sieve). Preferably, the ink comprises at least 95%, more preferably at least 98%, and especially preferably at least 99% by weight of components which are soluble in aqueous alkali. Preferably, the ink comprises at least 95%, more preferably at least 98%, and especially preferably at least 99% by weight of components which each have an alkali washability of at least 80%, preferably at least 90%, more preferably at least 95%, and especially preferably at least 99%.

The ink may contain an alkali soluble wax. The alkali soluble wax may be an organic acid such as a carboxylic acid. Suitable alkali soluble waxes are myristic acid, stearic acid, palmitic acid, lauric acid and other acid functional waxes such as the Unicid range from Baker Petrolite. Myristic acid is preferred. The wax preferably has an alkali washability of at least 80%, more preferably at least 90%, especially preferably at least 95%, and most preferably at least 99%. The ink optionally comprises at least 30%, preferably at least 50% by weight of one or more alkali soluble waxes. Optionally, the ink comprises no more than 99%, preferably no more than 90% by weight of the alkali soluble wax or waxes.

Preferably, the ink comprises one or more alkali soluble waxes having melting points in the range of from 40 to 80° C., preferably from 45 to 60° C. If the aqueous alkali used in the washing stage is heated to a temperature equal to or above the melting point of the wax the wax will melt during the washing and the ink will wash away from the solar cell substrate more quickly. Of course, if the etching or plating step is one involving an elevated temperature, the components of the ink should be selected such that the ink does not melt or soften at that elevated temperature.

As mentioned above, the ink will typically be printed onto a surface which may be silicon, silicon dioxide or a metal. The ink should exhibit acceptable adhesion to the substrate so that it does not come away from the substrate during the etching or plating. In general, resins increase adhesion to the substrate. Preferably, the ink comprises an alkali soluble resin. Preferably, the resin has an alkali washability of at least 80%, more preferably at least 90%, especially preferably at least 95%, and most preferably at least 99%. Suitable alkali soluble resins include acid functional rosins, modified rosins and modified rosin esters with residual acid value and also such products as Ennesin M57w, Ennesin PM45/HMP, Ennesin FM65 ex Lawter, Prince 2000, Prince 6500 ex Hexion and other products from Hercules, Pinova etc. Rosin ester resins with acid values are preferred alkali soluble resins. Whilst they increase adhesion to the substrate, which is desirable, resins will also tend to increase the melt viscosity of the ink thereby making it more difficult to jet. Optionally, the ink comprises up to 40% by weight, preferably up to 20% by weight of the alkali soluble resin or of a mixture of alkali soluble resins. Preferably, the ink comprises at least 2%, more preferably at least 5% by weight of an alkali soluble resin or of a mixture of such resins.

Whilst the inclusion of a colorant in the ink is not necessary, the ink preferably does comprise a colorant such as a pigment or a dye or a fluorescent agent so that the resist image is easily detectable. Advantageously, the process of the invention includes a step of detection and assessment of the resist image. Such a step allows rejection of solar cells having resist images which have significant imperfections, thereby enhancing the overall process quality. Preferably, the detection and assessment is automated. The colorant may be a dye, for example, any dye soluble in the ink eg the Orasol solvent soluble dyes ex Ciba or suitable fat/oil soluble dyes eg Oilsol ex BASF. Inks comprising fluorescent agents are particularly suitable for automated detection and assessment.

The ink may include further conventional ink additions such as stabilizers and wetting agents. Preferably, the ink comprises at least one stabilizer, colorant, antioxidant or wetting agent.

The silicon wafer and some other materials present in the solar cell, for example, silicon dioxide passivating layers, are easily scratched if contacted with a harder material. Defects in those layers may result in current leakage and a loss of efficiency. For that reason, the ink is preferably free of particulate materials as hard or harder than the surface onto which they are printed. Silicon dioxide is sometimes used in inks as an additive. Preferably, the ink comprises less than 1% by weight, more preferably less than 0.01% by weight of silicon dioxide.

In order that it be jetted efficiently, the ink preferably has a low melt viscosity. Preferably, the ink has a viscosity of no more than 20 mPas, more preferably no more than 12 mPas, at a temperature in the range of from 50-125 ° C. Advantageously, the ink is suitable for printing through a Spectra Nova 256 or S-class print head.

Test Method for Assessing Alkali Washability of Inks and Ink Components

1) Take a piece of copper sheet (approximately 25 mm×75 mm×1 mm thick) and weigh to 4 decimal places to give Wt(base)

2) Coat half the copper with the ink to be tested with a layer of ink approximately 15-30 microns thick. This can be achieved using a 24 micron draw down bar (Meyer rod). The precise thickness of the coating in the above range is not critical.

3) Weigh the coated copper to give Wt(base+ink)

4) Dip the coated copper into a beaker containing 5% KOH in water, at a temperature of 50° C. Agitate the slide in the solution for 5 minutes by side to side motion of the copper in the KOH solution.

5) Remove the copper from the KOH solution and rinse under running water. Collect the rinse water in a beaker.

6) Dry the copper in an oven at 40° C. for 30 minutes

7) Weight the copper to give Wt(base+residue)$_{as}$

8) Calculate the alkali washability as follows:

Alkali Washability=(Wt(base+ink)−Wt(base+residue))/(Wt(base+ink)−Wt(base))×100

Preferably, the ink or ink component is such that the KOH solution and rinse solution are free of large (<1 mm) pieces of ink in the form of lumps, flakes, and shards etc.

Test Method for Assessing Water Washability of Inks and Ink Components

1) Take a piece of copper sheet (approximately 25 mm×75 mm×1 mm thick) and weigh to 4 decimal places to give Wt(base)

2) Coat half the copper with the ink to be tested with a layer of ink approximately 15-30 microns thick. This can be achieved using a 24 micron draw down bar (Meyer rod). The precise thickness of the coating in the above range is not critical.

3) Weigh the coated copper to give Wt(base+ink)

4) Dip the coated copper into a beaker containing in water, at a temperature of 50° C. Agitate the slide in the solution for 5 minutes by side to side motion of the copper in the water.

5) Remove the copper from the water and rinse under running water. Collect the rinse water in a beaker.

6) Dry the copper in an oven at 40° C. for 30 minutes

7) Weight the copper to give Wt(base+residue)

8) Calculate the water washability as follows:

Water washability=(Wt(base+ink)−Wt(base+residue))/(Wt(base+ink)−Wt(base))×100

EXAMPLES

Specific embodiments of the invention will now be described for the purpose of illustration only.

Inks were prepared having the compositions shown in the table. The inks were then tested for alkali and water washability, and the results are also given in the table.

As can be seen, Example inks 1 to 4 each have a melt viscosity suitable for ink jet printing. They are all highly alkali washable but are not water washable.

Comparative Example 1 is a typical conventional hot melt ink jet ink formulation. As can be seen from the table, it is not alkali removable. It would therefore not be removable from a substrate by washing with aqueous alkali.

Comparative Example 2 is a water soluble hot melt ink jet ink. As can be seen from the table, it is removable by aqueous alkali and also by water. It would therefore be removed during an etching or plating step, or in a water rinse associated with that step.

The invention claimed is:

1. A process of manufacturing a solar cell comprising the steps of:
   i) ink jet printing an alkali removable water insoluble hot melt ink jet ink onto a substrate comprising a silicon wafer to form a resist image on the substrate, said ink having a low melt viscosity of no more than 20 mPas at a temperature range of from 50-125° C.;
   ii) etching or plating the substrate in an aqueous acid medium; and
   iii) removing the resist image with an aqueous alkali,
wherein said ink comprises 50% to 99% by weight of one or more alkali soluble wax and an alkali soluble resin and wherein the ink comprises 95% by weight or more of alkali soluble components,
   wherein the one or more alkali soluble wax has an alkali washability of at least 80%, and
   wherein the ink has an alkali washability of at least 80%.

2. The process according to claim 1 in which the substrate is a silicon wafer having a passivating layer of silicon dioxide on at least one surface and in which in step i) the ink jet ink is printed onto the passivating layer and in step ii) the passivating layer is etched.

3. The process according to claim 2 in which the passivating layer is etched using an aqueous solution of hydrogen fluoride and/or ammonium fluoride.

4. The process according to claim 1 in which the substrate comprises a surface metal layer and in which in step i) the ink jet ink is printed onto the metal layer.

5. The process according to claim 4 in which the metal layer is a layer of copper, titanium-tungsten, or aluminum.

6. The process according to claim 1 in which in step ii) a metal selected from the group consisting of copper and tin is electroplated onto the substrate.

|  | Example 1 | Example 2 | Example 3 | Example 4 | Comparative Example 1 | Comparative Example 2 |
|---|---|---|---|---|---|---|
| Unilin 425 (2) |  |  |  |  | 79.5 |  |
| PEG 1000 |  |  |  |  |  | 98.5 |
| Myristic Acid | 98.5 | 88.5 | 60 |  |  |  |
| Stearic Acid |  |  | 28.5 | 88.5 |  |  |
| Rosin Ester Resin (1) |  | 10 | 10 | 10 | 19 |  |
| Dye - Orasol Black RLI (3) | 1 | 1 | 1 | 1 | 1 | 1 |
| Tween 80 Wetting agent | 0.5 | 0.5 | 0.5 | 0.5 | 0.5 | 0.5 |
| Viscosity cps @ Temperature | 8.1 | 12.6 | 12.6 | 12.4 | 10.3 | 11.9 |
|  | 60° C. | 60° C. | 70° C. | 75° C. | 125° C. | 115° C. |
| Alkali Washability % | 100 | 100 | 100 | 98 | 0 | 100 |
| Water Washability % | 0 | 0 | 0 | 0 | 0 | 100 |

Notes:
(1) = Ennesin M57W ex Lawter
(2) ex Baker Petrolite
(3) ex Ciba

7. The process according to claim 1 which is a method of electroplating in which step ii) involves dipping the substrate into a bath of an aqueous solution of sulphuric acid and a metal salt.

8. The process according to claim 1 in which in step ii) a metal layer is etched.

9. The process according to claim 8 in which the etching is carried out using an aqueous solution comprising sulphuric acid and hydrogen peroxide.

10. The process according to claim 8 in which the etching is carried out using an etching solution including phosphoric acid, acetic acid, water and nitric acid.

11. The process according to claim 1 in which following step i) the resist image is assessed by an automated assessment apparatus for the detection of imperfections.

12. The process according to claim 11 in which the ink comprises a colorant or a fluorescent agent and the automated assessment involves photo detection of the image.

13. The process according to claim 1 in which in step iii) the aqueous alkali is aqueous potassium hydroxide.

14. The process according to claim 1 in which in the removing step iii) the resist ink disperses in the aqueous alkali to form a solution in which less than 5% by weight of the resist ink is in the form of particles which would be retained by a 10 micron filter.

15. The process according to claim 1 in which the ink is substantially free of particulates.

16. The process according to claim 1, wherein said alkali soluble wax comprises acid functionality.

17. The process according to claim 16, wherein said alkali soluble wax is selected from myristic acid, stearic acid, palmitic acid, lauric acid and mixtures thereof.

18. The process according to claim 1, wherein said alkali soluble wax is greater than 50% by weight of said hot melt ink.

19. The process according to claim 18, wherein said alkali soluble wax is less than about 90% by weight of said hot melt ink.

* * * * *